(12) United States Patent
Liao et al.

(10) Patent No.: US 7,858,529 B2
(45) Date of Patent: Dec. 28, 2010

(54) TREATMENT METHOD OF SEMICONDUCTOR, METHOD FOR MANUFACTURING MOS, AND MOS STRUCTURE

(75) Inventors: Chin-I Liao, Tai-Nan (TW); Chin-Cheng Chien, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 902 days.

(21) Appl. No.: 11/611,891

(22) Filed: Dec. 18, 2006

(65) Prior Publication Data

US 2008/0142886 A1 Jun. 19, 2008

(51) Int. Cl.
*H01L 21/302* (2006.01)
*H01L 21/461* (2006.01)

(52) U.S. Cl. .............................. 438/704; 257/E21.245; 257/E21.42; 257/E21.431; 438/360; 438/429; 438/442; 438/689; 438/706

(58) Field of Classification Search .......... 257/E21.245, 257/E21.42, E21.431; 438/360, 429, 442, 438/689, 704, 706
See application file for complete search history.

(56) References Cited

U.S. PATENT DOCUMENTS

| 5,904,574 | A | * | 5/1999 | Nishijima | 438/758 |
| 7,611,951 | B2 | * | 11/2009 | Ueno et al. | 438/300 |
| 2002/0106892 | A1 | | 8/2002 | Shibata | |
| 2006/0148220 | A1 | * | 7/2006 | Lindert et al. | 438/514 |
| 2006/0151808 | A1 | | 7/2006 | Chen | |
| 2006/0166492 | A1 | | 7/2006 | Orlowski | |
| 2007/0269952 | A1 | * | 11/2007 | Chong et al. | 438/301 |

FOREIGN PATENT DOCUMENTS

| TW | 200625523 | 7/2006 |
| TW | I260091 | 8/2006 |
| TW | I262597 | 9/2006 |

OTHER PUBLICATIONS

ULSI Technology, Sze, 1996 (ISBN:0-07-114105-7), p. 354-355.

* cited by examiner

*Primary Examiner*—Asok K Sarkar
(74) *Attorney, Agent, or Firm*—Winston Hsu; Scott Margo (57) ABSTRACT

The method of the present invention includes providing a semiconductor substrate with a recess; performing a pre-cleaning step on the semiconductor substrate; and performing a first reduction step, a lateral etching step and a second reduction step on the semiconductor substrate. The MOS structure includes a semiconductor substrate, a gate structure on the semiconductor substrate, a pair of recesses with beak sections extending to and under the gate structure, and a strain material filling the recess. The recess inside the semiconductor substrate processed by the method including the lateral etching step forms a beak section.

40 Claims, 9 Drawing Sheets

TREATMENT METHOD OF SEMICONDUCTOR, METHOD FOR MANUFACTURING MOS, AND MOS STRUCTURE

BACKGROUND OF THE INVENTION

1. Field of the Invention

The present invention relates to a treatment method of semiconductor, a method for manufacturing MOS, and a MOS structure. In particular, the present invention relates to a method including a lateral etching step and a MOS structure so as to form a beak section in a recess in the MOS structure.

2. Description of the Prior Art

To increase the carrier mobility in the gate channel and decrease the resistance between the source and drain, in the semiconductor process a pair of recess are first formed at the both sides of the gate structure and a strained material such as C—Si and Si—Ge fills the recesses by a selective area epitaxial (SAE) so as to enhance the performance of the MOS.

However, before the strained material fills the recesses, a pre-cleaning step is usually performed on the surface of the substrate, especially on the surface of the recess, to facilitate the growth of the epitaxial afterwards. This so-called "pre-cleaning" usually includes treating the surface of the substrate with HCl gas under a low pressure. Because HCl gas would destroy the integrity of the surface of the substrate, a further vacuum treatment is carried out to treat the surface of the substrate to enhance the migration of Si to restore the integrity of the surface of the substrate. Finally, hydrogen gas is used to further treat the surface of the substrate to remove remaining chlorine and residues for the following epitaxial.

Because a layer of native oxide is spontaneously formed on the surface of the Si substrate once exposed to the air and the removal of the native oxide by the treatment of HCl gas is intrinsically ineffective and it takes so long to perform the vacuum treatment as well as to perform the HCl treatment, it is indeed necessary to provide a time-saving and more efficient method to treat the surface of the substrate. It would be even better if the stress of the gate channel is simultaneously enhanced.

SUMMARY OF THE INVENTION

The present invention therefore provides a treatment method of semiconductor, a method for manufacturing MOS, and a MOS structure. The method of the present invention does not involve treating the surface of the substrate with HCl gas in the first place and also omits the step of vacuum treatment, so the method of the present invention is not only time-saving, but also more efficient. In addition, in the MOS structure of the present invention, the recess forms a beak section extending to and under the gate structure. In such a way, it not only shortens the length of the gate channel, but also enhances the stress of the gate channel.

The present invention in one aspect provides a method for treating a semiconductor, comprising:
 providing a semiconductor substrate including a recess;
 performing a pre-cleaning process on the semiconductor substrate; and
 performing a first reduction step, a lateral etching process and a second reduction step on the semiconductor substrate.

The first reduction step may remove the native oxide in a more effective way and the lateral etching process may substantially shorten the length of the gate channel.

The present invention in another aspect provides a method for fabricating a metal-oxide-semiconductor (MOS), comprising:
 providing a substrate;
 forming a gate structure on the substrate;
 forming a pair of recesses under the sidewalls of the gate structure and the recess is next to the sidewalls;
 performing a pre-cleaning process on the substrate; and
 performing a first reduction step, a lateral etching process and a second reduction step on the substrate.

The first reduction step may remove the native oxide in a more effective way and the lateral etching process, which makes the recesses form beak sections extending to and under the gate structure, may substantially shorten the length of the gate channel.

The present invention further provides a MOS structure, comprising:
 a semiconductor substrate;
 a gate structure on the semiconductor substrate;
 a pair of recesses under the sidewalls of the gate structure and with beak sections extending to and under the gate structure; and
 a strained material filling the recesses.

The beak sections extending to and under the gate structure may substantially shorten the length of the gate channel.

According to the method of the present invention, the total process time is reduced due to the omission of the vacuum treatment. Further, the native oxide can be more efficiently removed because of the first reduction step instead of a conventional treatment of the surface of the substrate with HCl gas in the first place. The following lateral etching process may substantially shorten the length of the gate channel to enhance the performance of the MOS. In addition, in the MOS structure of the present invention the formation of the beak sections extending to and under the gate structure in the recess not only shortens the length of the gate channel, but also enhances the stress of the gate channel once the strained material fills the recesses.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a treatment method of semiconductors, a method for manufacturing MOS and a MOS structure. The method of the present invention omits the step of treating the surface of the substrate with HCl gas in the first place as well as omits the step of vacuum treatment, so the method of the present invention is not only time-saving, but also more efficient in removing the native oxide. In addition, in the MOS structure of the present invention under the gate structure there are beak sections extending from the recess. The extension of the beak sections not only shortens the length of the gate channel, but also enhances the stress of the gate channel when a strained material fills the recess.

Figure 1:
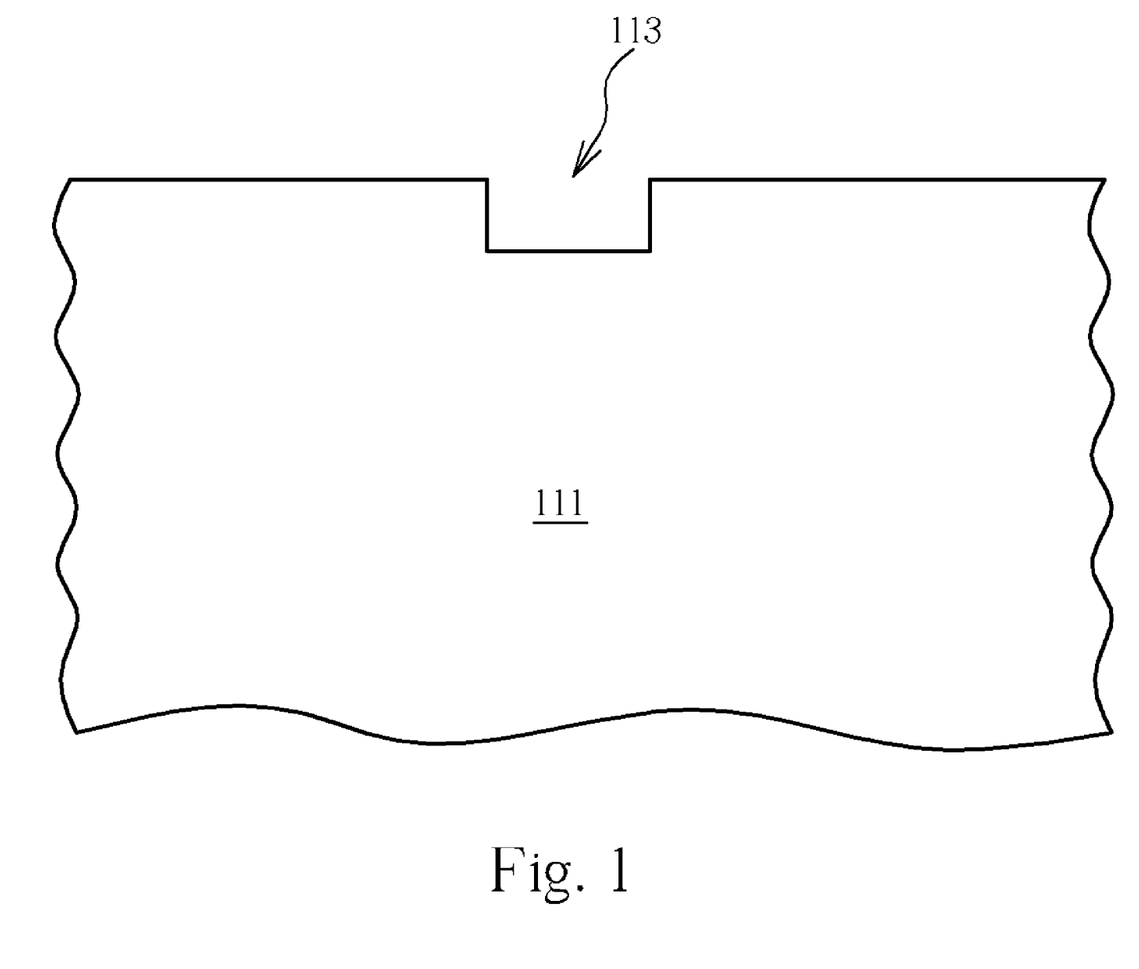
FIG. 1 to FIG. 3 illustrates the method of treatment of the present invention.
Figure 2:
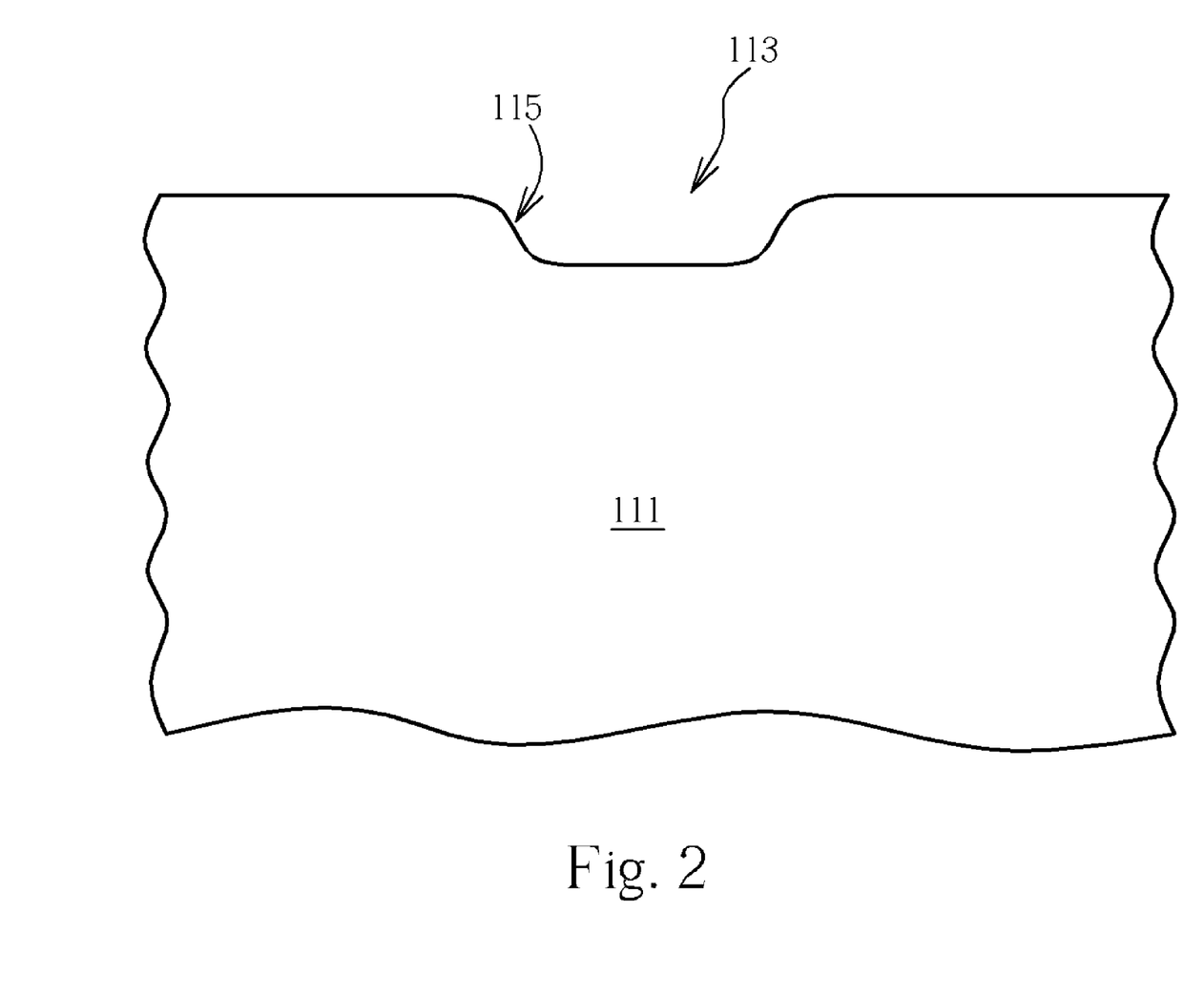
Figure 3:
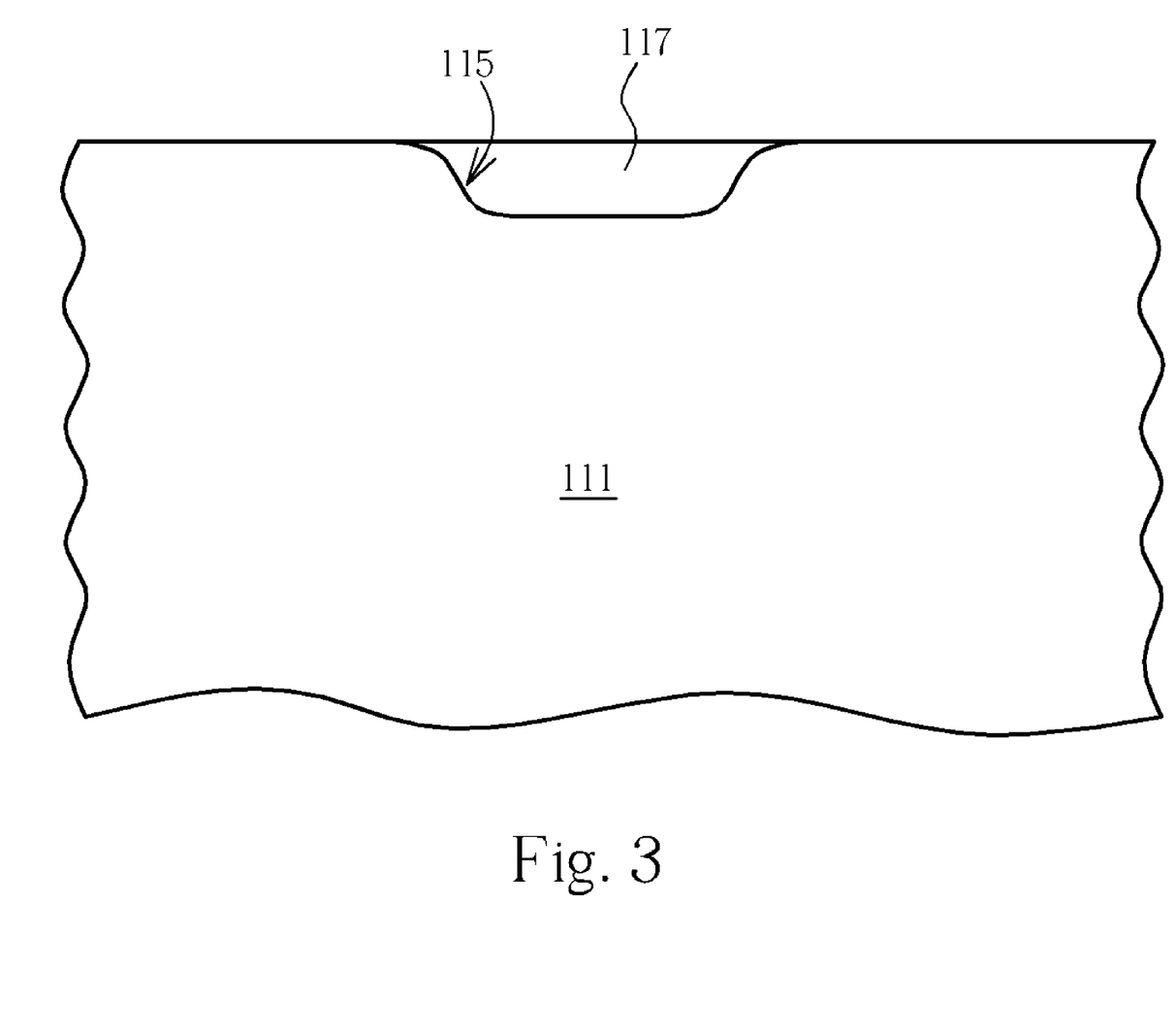

FIG. 1 to FIG. 3 illustrates the treatment method of the present invention. For the purpose of illustration, the figures may not be drawn to scale. As shown in FIG. 1, the treatment method of the present invention first provides a semiconductor substrate 111 with a recess 113. The semiconductor substrate may be Si, Ge, C—Si, silicon on insulator (SOI), Si—Ge on insulator, compound semiconductor, multilayer semiconductor or the combination thereof. The recess 113 on the surface of the semiconductor substrate 111 may be formed by any suitable semiconductor process, such as etching to obtain at least a recess 113 on the semiconductor substrate 111.

Because there may be a native oxide layer (not shown) on the surface of the semiconductor substrate 111, especially on the fresh surface of the recess 113, in one preferred embodiment of the present invention a pre-cleaning process is first performed on the semiconductor substrate 111 to remove the native oxide (not shown) on the surface of the semiconductor substrate 111, especially on the fresh surface of the recess 113, before the following steps. Preferably, the pre-cleaning process includes treating the semiconductor substrate 111 with a hydrogen fluoride (HF) solution. For example, the concentration of the HF solution is water:HF=200:1. Additionally, if necessary, it may further include treating the semiconductor substrate 111 with ozone ($O_3$) before treating the semiconductor substrate 111 with the HF solution.

After treating the semiconductor substrate 111 with an HF solution, a first reduction step is performed on the semiconductor substrate 111. The first reduction step may include treating the semiconductor substrate 111 with a first reduction gas under a first temperature for a duration of time and is useful in reducing the remaining native oxide on the surface of the semiconductor substrate 111. For example, the flow rate of the first reduction gas is 1-35 s.c.c.m., the partial pressure of the first reduction gas is 1-15 torr, the first temperature is between 750-850° C and for 30-60 seconds. The first reduction gas preferably includes hydrogen. For instance, using hydrogen gas under a temperature between 750-850° C. may reduce the silicon oxide on the surface of the semiconductor substrate 111 to be silicon as much as possible.

Now a lateral etching process may be optionally performed on the semiconductor substrate 111, as shown in FIG. 2. The lateral etching process may preferably include treating the semiconductor substrate 111 with an etching gas under a second temperature, like 700-800° C. for 1-4 minutes for adjusting the aspect ratio of the recess 113. The etching gas may preferably include an HX (X=halogen) and a second reduction gas. The HX is a compound of hydrogen and halogen and preferably HCl, HBr or the combination thereof. For example, the flow rate of the HX is 500-800 s.c.c.m with a partial pressure of 150-250 torr. The second reduction gas may preferably include a silane for fixing the surface damaged by the HX.

It is well noticed that the lateral etching process may appropriately adjust the aspect ratio and the shape of the recess 113. For example, the recess may have an aspect ratio between 3.1-3.5 before the lateral etching step and an aspect ratio between 1.5-1.9 after the lateral etching step. Also, the recess 113 may additionally be tapered to form a taper 115.

Afterwards, a second reduction step is performed on the semiconductor substrate 111 to remove the remaining chlorine and the residues on the surface of the semiconductor substrate 111. The second reduction step generally resembles the first reduction step, for example, using the first reduction gas to treat the semiconductor substrate 111 under a temperature between 750-850° C. for 30-60 seconds. The flow rate of the first reduction gas may be 1-35 s.c.c.m. with a partial pressure of 1-15 torr. The first reduction gas preferably includes hydrogen.

After using the second reduction step to remove the remained chlorine and the residues on the surface of the recess 113, a selective area epitaxial (SAE) process may be performed to selectively fill the recess 113 with a proper material 117, as shown in FIG. 3. The selective area epitaxial process may be a Si—Ge epitaxial process or a C—Si epitaxial process, which depends on the method itself or the nature of the elements. In other words, the material 117 may be a Si—Ge epitaxial strained material or a C—Si epitaxial strained material.

The method of the present invention not only omits the step of treating the surface of the substrate with HCl gas in the first place, but also the step of vacuum treatment, so the improvement of the present invention is not only time-saving, but also more efficient in removing the native oxide. In addition, the method of the present invention may appropriately adjust the aspect ratio and the shape of the recess in the semiconductor substrate. Preferably, the recess may additionally be tapered to form a taper, and the aspect ratio may be decreased.

Figure 4:
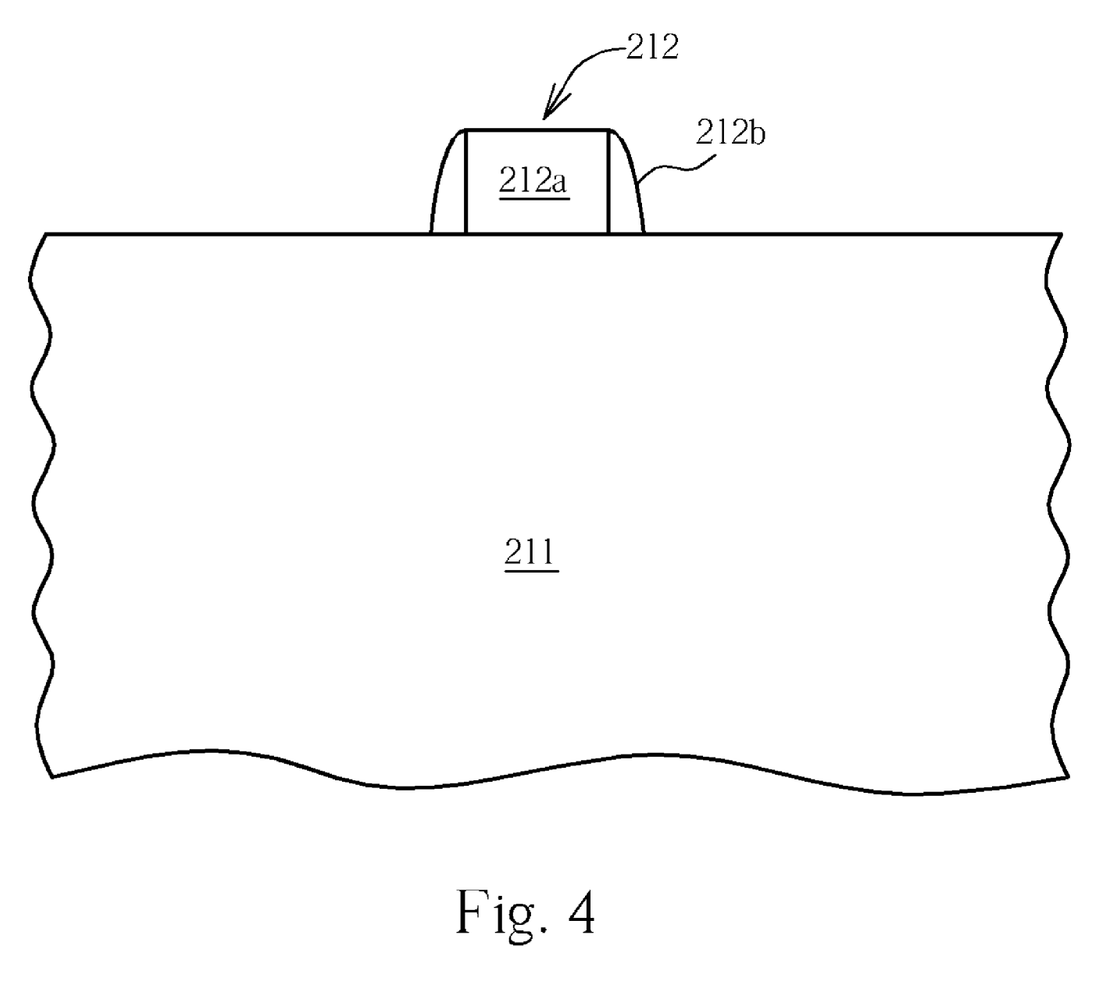
FIG. 4 to FIG. 7 illustrates the method for fabricating the metal-oxide-semiconductor (MOS) of the present invention.

FIG. 4 to FIG. 7 illustrates the method for fabricating a metal-oxide-semiconductor (MOS) of the present invention. As shown in FIG. 4, first a semiconductor substrate 211 is provided. The semiconductor substrate 211 may be Si, Ge, C—Si, silicon on insulator (SOI), Si–Ge on insulator, compound semiconductor, multilayer semiconductor or the combination thereof. Any conventional process may be used to form a gate structure 212 on the semiconductor substrate 211. For example, the gate structure 212 may include the gate 212a and the sidewalls 212b. The formation of the gate structure 212 will not be described in detail here.

Figure 5:
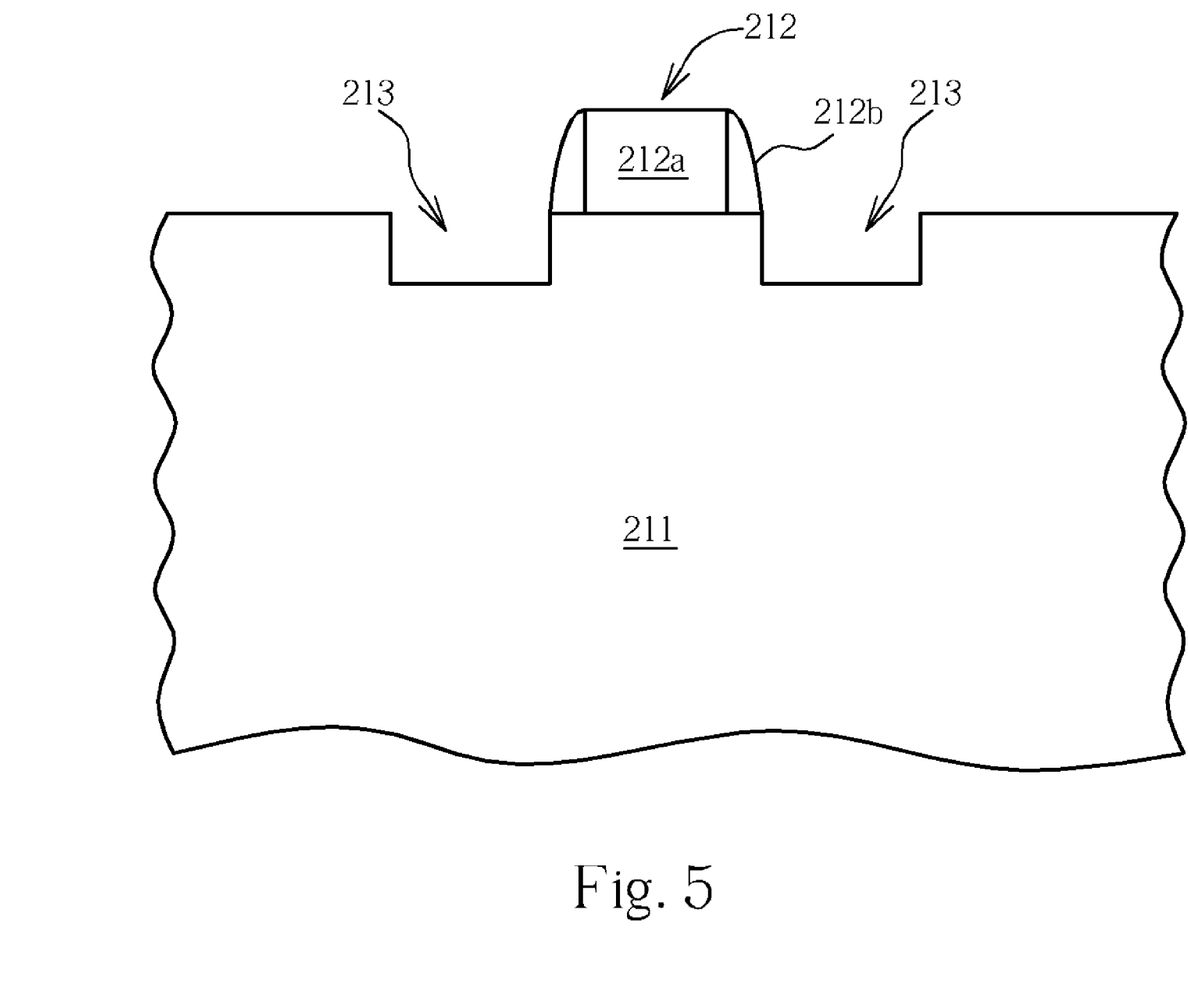

Afterwards, as shown in FIG. 5, outside and under the pair of the sidewalls 212b of the gate structure 212 in the semiconductor substrate 211 a pair of recesses 213 are formed, which are next to the sidewalls 212b. Similarly, the formation of a pair of recesses 213 on the semiconductor substrate 211 may be accomplished by any conventional process and will not be described in detail here. Because there may be a native oxide layer (not shown) on the surface of the semiconductor substrate 211, especially on the fresh surface of the recess 213, in one preferred embodiment of the present invention a pre-cleaning process is preliminarily performed on the semiconductor substrate 211 to remove the native oxide before the following steps. Preferably, the pre-cleaning process includes treating the semiconductor substrate 211 with an HF solution. For example, the concentration of the HF solution may be water:HF=200:1. Additionally, if necessary, it may include treating the semiconductor substrate 211 with ozone ($O_3$) before treating the semiconductor substrate 211 with the HF solution.

Then a first reduction step is performed on the semiconductor substrate 211. The first reduction step may be useful in reducing the native oxide on the surface of the semiconductor substrate 211. The first reduction step may include treating the semiconductor substrate 211 with a first reduction gas under a first temperature for a duration of time. For example, the flow rate of the first reduction gas is 1-35 s.c.c.m. with a partial pressure of 1-15 torr, the first temperature is between 750-850° C. and for 30-60 seconds. The first reduction gas preferably includes hydrogen. For instance, using hydrogen gas under a temperature between 750-850° C. may reduce the silicon oxide on the surface of the semiconductor substrate 211 to be silicon as much as possible.

Figure 6:
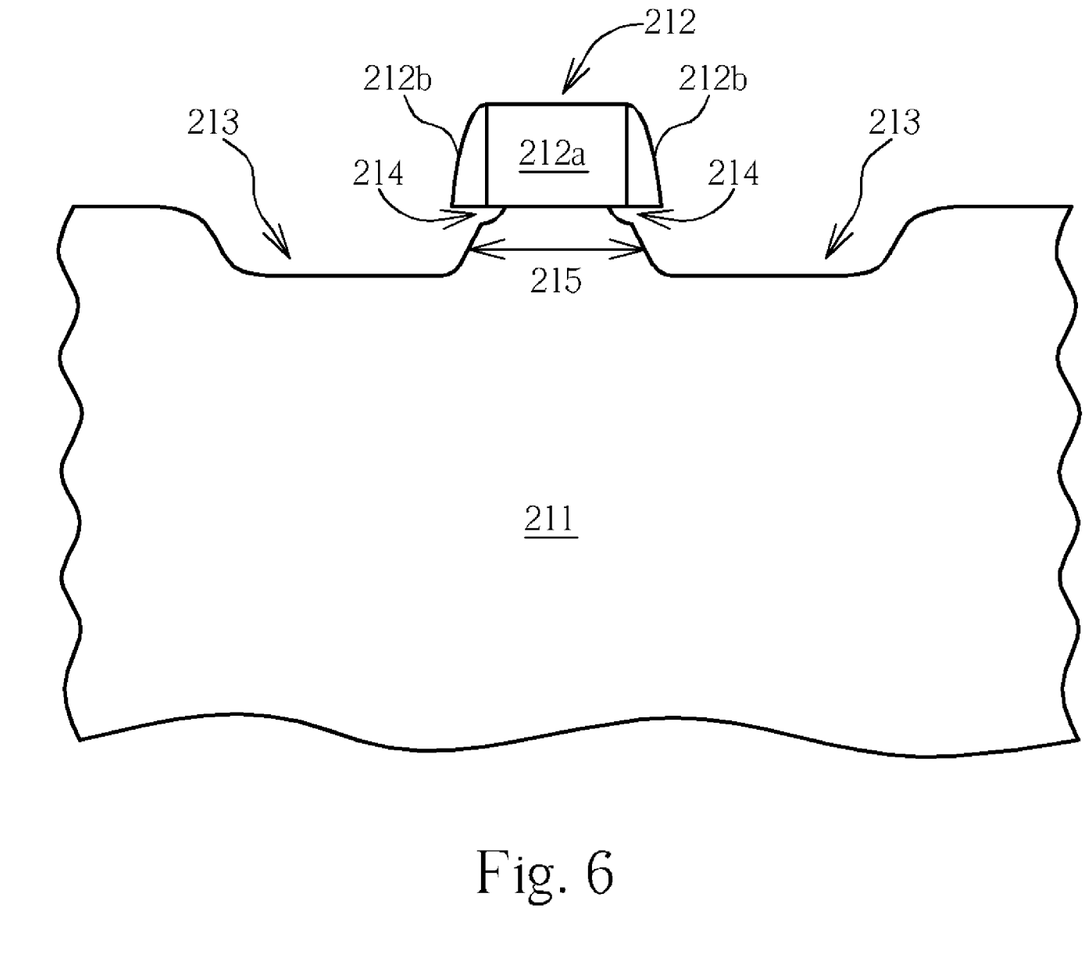

Now a lateral etching process may be optionally performed on the semiconductor substrate 211, as shown in FIG. 6. For example, the lateral etching process may include treating the semiconductor substrate 211 with an etching gas under a temperature, like 700-800° C. for 1-4 minutes for adjusting the profile of the recess 213. The etching gas may preferably include an HX (X=halogen) and a second reduction gas. The HX is a compound of hydrogen and halogen and preferably HCl, HBr or the combination thereof. For example, the flow rate of the HX is 500-800 s.c.c.m with a partial pressure of 150-250 torr. The second reduction gas may preferably include a silane for fixing the surface damaged by the HX.

It is well noticed that the lateral etching process may appropriately adjust the profile of the recess 213. For example, the recess 213 may form a beak section 214 extending to and under the gate structure 212. Hence, the length of the gate channel 215 under the gate structure 212 shortens.

Besides, the lateral etching process may also appropriately adjust the aspect ratio of the recess 213. For example, the recess 213 may have an aspect ratio between 3.1-3.5 before the lateral etching step and an aspect ratio between 1.5-1.9 after the lateral etching step. In other words, the lateral etching step of anisotropic feature makes much more lateral than vertical etching.

Afterwards, a second reduction step is performed on the semiconductor substrate 211 to remove the remained chlorine and the residues on the surface of the semiconductor substrate 211. The second reduction step generally resembles the first reduction step, for example, using the first reduction gas to treat the semiconductor substrate 211 under a temperature between 750-850° C. for 30-60 seconds. The flow rate of the first reduction gas may be 1-35 s.c.c.m. with a partial pressure 1-15 torr. The first reduction gas preferably includes hydrogen.

Figure 7:
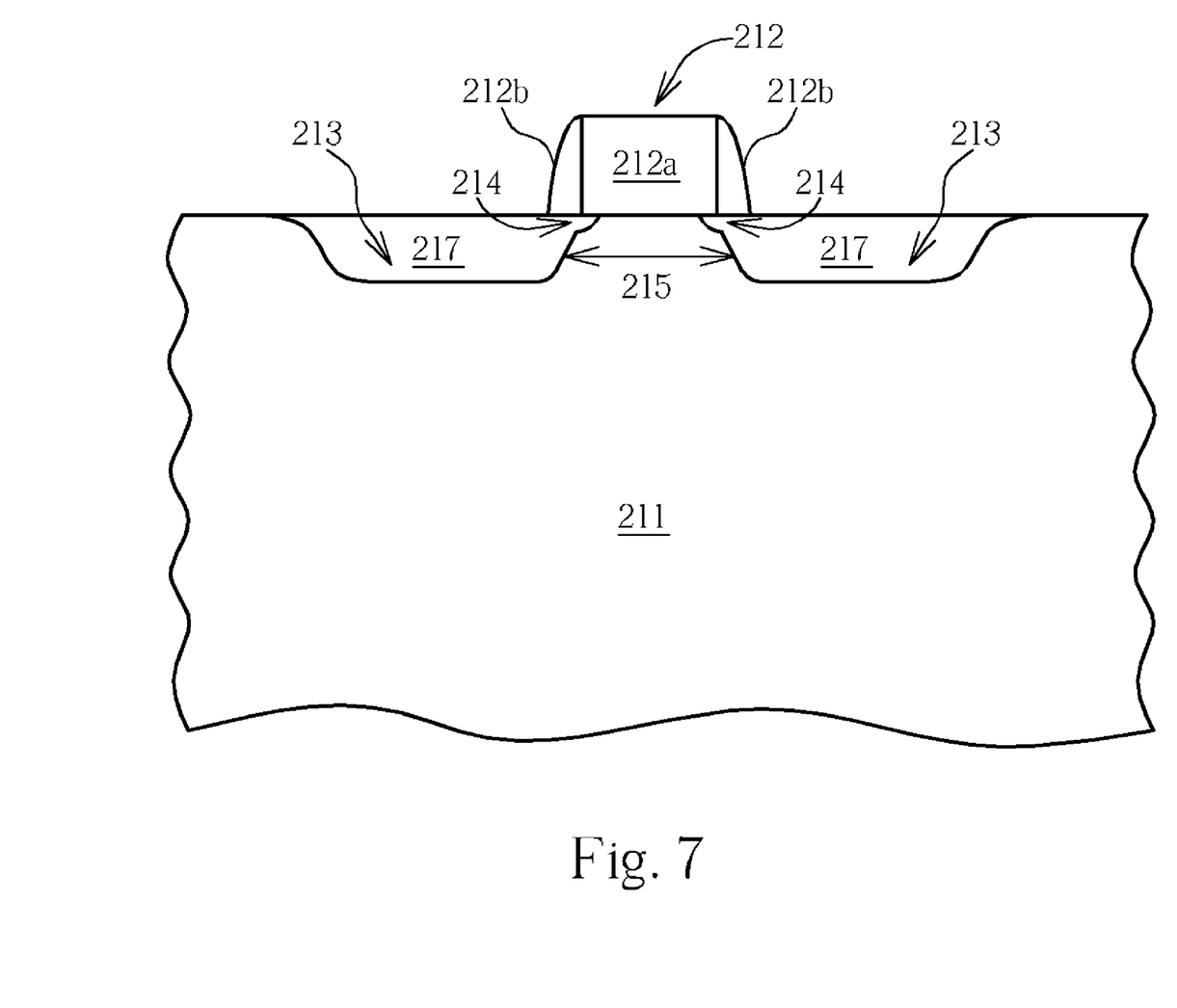

After using the second reduction step to remove the remaining chlorine and the residues on the surface of the recess 213, a selective area epitaxial (SAE) process may be performed to selectively fill the recess 213 with a proper material 217, as shown in FIG. 7 and to change the stress in the gate channel 215 under the gate structure 212. The selective area epitaxial process may be a Si—Ge epitaxial process or a C—Si epitaxial process, which depends on the method itself or the nature of the elements. For example, for the PMOS transistors the material 217 may be a Si—Ge epitaxial strained material, and for the NMOS transistors the material 217 may be a C—Si epitaxial strained material. Since the gate channel 215 is shortened by the lateral etching process and the material 217 further changes the stress in the gate channel 215, the method of the present invention greatly enhances the performance of the MOS.

Because the method of the present invention omits the step of vacuum treatment, it shortens the process time. Moreover, the method of the present invention also omits the step of treating the surface of the substrate with HCl gas in the first place but introduces a first reduction step, which allows it to more efficiently remove the native oxide on the surface of the substrate. Furthermore, the lateral etching process shortens the length of the gate channel 215, and the performance of the MOS is therefore enhanced.

Figure 8:
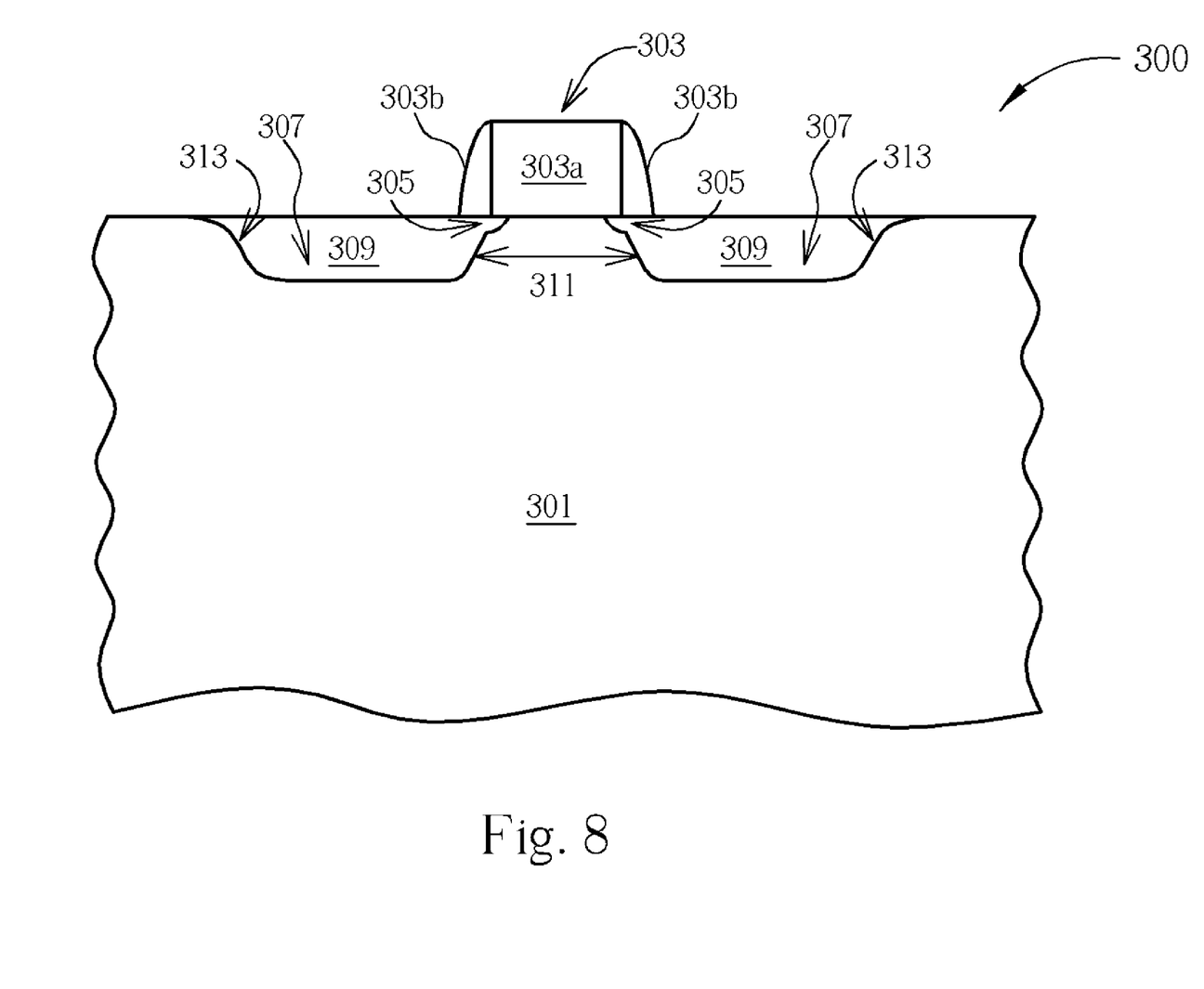
FIG. 8 illustrates the MOS structure of the present invention.

The present invention also provides a MOS structure 300, as shown in FIG. 8. The MOS structure 300 includes a semiconductor substrate 301, a gate structure 303 on the semiconductor substrate 301, a pair of recesses 307 under the sidewalls of the gate structure 301 and with beak sections 305 extending to and under the gate structure 303 and a strained material 309 filling the recesses 307. The substrate 301 may include Si, Ge, C—Si, silicon on insulator (SOI), Si—Ge on insulator, compound semiconductor, multilayer semiconductor or the combination thereof. Any conventional process may be used to form the gate structure 303 and the pair of recesses 307 on the substrate 301. The gate structure 212 may include the gate 303a and the sidewalls 303b. The details will not be described here.

A pair of recesses 307 is next to the sidewalls 303b and has the beak sections 305 extending from the recesses 307 to and under the gate structure 303 as shown in FIG. 8. Due to the extending beak sections 305, the gate channel 311 under the gate structure 303 is shortened. The recess 307 usually has an aspect ratio between 1.5-1.9 and preferably is tapered to have a taper 313.

The strained material 309 filling the recesses 307 may be Si—Ge strained material or a C—Si epitaxial strained material. Both the Si—Ge strained material and the C—Si epitaxial strained material may change the stress of the recesses 307. The stress may enhance the mobility of the carriers in the gate channel and the performance of the MOS.

Figure 9:
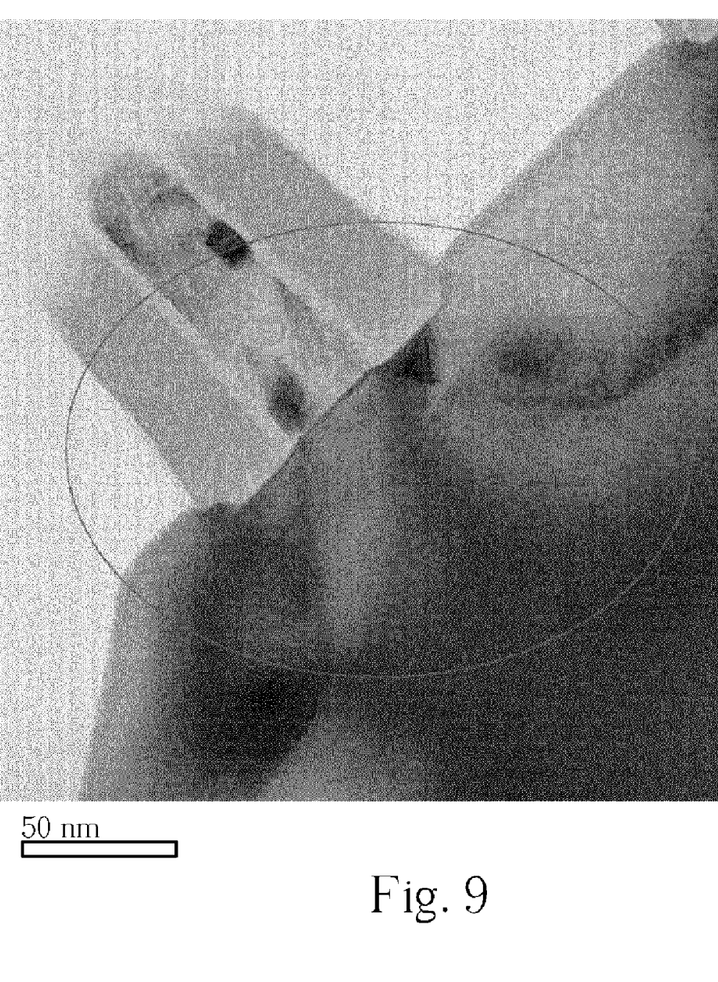
FIG. 9 illustrates the MOS structure of the present invention taken by a scanning electron microscope (SEM).

A picture taken by a scanning electron microscope (SEM) to illustrate the MOS structure of the present invention is shown in FIG. 9. It is clear that the gate structure is on the semiconductor substrate with a pair of recesses on both sides and the beak sections extends from the recess to and under the gate structure. The taper is on the other side of the recess.

According to the method of the present invention, the total process time is reduced due to the omission of the vacuum treatment. Further, the native oxide can be more efficiently removed because of the first reduction step instead of the conventional treatment of the surface of the substrate with HCl gas in the first place. The following lateral etching process may substantially shorten the length of the gate channel to enhance the performance of the MOS. In addition, in the MOS structure of the present invention the formation of the beak sections extending to and under the gate structure in the recess not only shortens the length of the gate channel, but also enhances the strain of the gate channel once the strained material fills the recesses.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for treating a semiconductor, comprising:
providing a semiconductor substrate comprising a recess;
performing a pre-cleaning process on said semiconductor substrate;
performing a first reduction step on said semiconductor substrate after performing said pre-cleaning process on said semiconductor substrate;
performing a lateral etching process on said semiconductor substrate after performing the first reduction step on said semiconductor substrate; and
performing a second reduction step on said semiconductor substrate.

2. The method of claim 1, wherein said pre-cleaning process comprises treating said semiconductor substrate with a hydrogen fluoride (HF) solution.

3. The method of claim 2, wherein the concentration of said HF solution is water:HF=200:1.

4. The method of claim 2, further comprising treating said semiconductor substrate with ozone before treating said semiconductor substrate with said HF solution.

5. The method of claim 1, wherein said first reduction step and said second reduction step independently comprise treating said semiconductor substrate with a first reduction gas under a first temperature.

6. The method of claim 5, wherein the flow rate of said first reduction gas is 1-35 s.c.c.m.

7. The method of claim 5, wherein said first temperature is between 750-850° C.

8. The method of claim 5, wherein the partial pressure of said first reduction gas is 1-15 torr.

9. The method of claim 5, wherein said semiconductor substrate is treated with said first reduction gas under said first temperature for 30-60 seconds.

10. The method of claim 5, wherein said first reduction gas comprises hydrogen.

11. The method of claim 1, wherein said lateral etching process comprises treating said semiconductor substrate with an etching gas under a second temperature.

12. The method of claim 11, wherein said etching gas comprises an HX (X=halogen) and a second reduction gas.

13. The method of claim 12, wherein the flow rate of said HX is 500-800 s.c.c.m.

14. The method of claim 12, wherein said HX is selected from the group consisting of HCl and HBr.

15. The method of claim 12, wherein said second reduction gas comprises a silane.

16. The method of claim 12, wherein the partial pressure of said HX is 150-250 torr.

17. The method of claim 11, wherein said second temperature is between 700-800° C.

18. The method of claim 11, wherein said semiconductor substrate is treated with said etching gas under said second temperature for 1-4 minutes.

19. The method of claim 11, wherein said recess has an aspect ratio between 3.1-3.5 before said lateral etching step and an aspect ratio between 1.5-1.9 after said lateral etching step.

20. The method of claim 1, further comprising performing a selective area epitaxial (SAE) process selected from the group consisting of Si—Ge epitaxial process and C—Si epitaxial process on said recess after performing said second reduction step.

21. A method for fabricating a metal-oxide-semiconductor (MOS), comprising:
   providing a substrate;
   forming a gate structure on said substrate;
   forming a pair of recesses under the sidewalls of said gate structure, said recess being next to the sidewalls;
   performing a pre-cleaning process on said substrate;
   performing a first reduction step on said substrate after performing said pre-cleaning process on said semiconductor substrate;
   performing a lateral etching process on said substrate so that said recesses form beak sections extending to and under said gate structure; and
   performing a second reduction step on said substrate.

22. The method of claim 21, wherein said pre-cleaning process comprises treating said substrate with an HF solution.

23. The method of claim 22, wherein the concentration of said HF solution is water:HF=200:1.

24. The method of claim 22, further comprising treating said substrate with ozone before treating said substrate with said HF solution.

25. The method of claim 21, wherein said first reduction step and said second reduction step independently comprise treating said substrate with a first reduction gas under a first temperature.

26. The method of claim 25, wherein the flow rate of said first reduction gas is 1-35 s.c.c.m.

27. The method of claim 25, wherein said first temperature is between 750-850° C.

28. The method of claim 25, wherein the partial pressure of said first reduction gas is 1-15 torr.

29. The method of claim 25, wherein said substrate is treated with said first reduction gas under said first temperature for 30-60 seconds.

30. The method of claim 25, wherein said first reduction gas comprises hydrogen.

31. The method of claim 21, wherein said lateral etching process comprises treating said substrate with an etching gas under a second temperature.

32. The method of claim 31, wherein said etching gas comprises an HX (X=halogen) and a second reduction gas.

33. The method of claim 32, wherein the flow rate of said HX is 500-800 s.c.c.m.

34. The method of claim 32, wherein said HX is selected from the group consisting of HCl and HBr.

35. The method of claim 32, wherein said second reduction gas comprises a silane.

36. The method of claim 32, wherein the partial pressure of said HX is 150-250 torr.

37. The method of claim 31, wherein said second temperature is between 700-800° C.

38. The method of claim 31, wherein said substrate is treated with said etching gas under said second temperature for 1-4 minutes.

39. The method of claim 21, wherein said recesses have an aspect ratio between 3.1-3.5 before said lateral etching step and an aspect ratio between 1.5-1.9 after said lateral etching step.

40. The method of claim 21, further comprising performing a selective area epitaxial process selected from the group consisting of Si—Ge epitaxial process and C—Si epitaxial process on said recesses after performing said second reduction step.

* * * * *